(12) United States Patent
Kitagawa et al.

(10) Patent No.: US 7,944,015 B2
(45) Date of Patent: May 17, 2011

(54) SEMICONDUCTOR DEVICE AND METHOD OF MANUFACTURING THE SAME

(75) Inventors: Katsuhiko Kitagawa, Gunma (JP); Hiroyuki Shinogi, Gunma (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 301 days.

(21) Appl. No.: 12/177,696

(22) Filed: Jul. 22, 2008

(65) Prior Publication Data

US 2009/0026610 A1   Jan. 29, 2009

(30) Foreign Application Priority Data

Jul. 27, 2007 (JP) ................................ 2007-195820

(51) Int. Cl.
*H01L 31/113* (2006.01)
(52) U.S. Cl. .................. 257/435; 257/E31.119; 257/81; 257/98; 257/737; 438/113; 250/239
(58) Field of Classification Search ............. 257/E23.01, 257/E21.505, 737, 753, 789, 729, 532, 433–435, 257/228, 253, 414, 81, 98–100, E31.119; 438/113, 118, 119; 428/131, 137, 166; 250/239
See application file for complete search history.

(56) References Cited

U.S. PATENT DOCUMENTS

| | | | |
|---|---|---|---|
| 4,242,695 A | 12/1980 | Ouchi et al. | |
| 5,656,816 A | 8/1997 | Tanaka | |
| 5,804,827 A | 9/1998 | Akagawa et al. | |
| 5,929,440 A | 7/1999 | Fisher | |
| 5,973,337 A | 10/1999 | Knapp et al. | |
| 6,165,814 A | 12/2000 | Wark et al. | |
| 6,228,676 B1 | 5/2001 | Glenn et al. | |
| 6,229,223 B1 | 5/2001 | Watanabe | |
| 6,326,689 B1 | 12/2001 | Thomas | |
| 6,372,351 B1 | 4/2002 | Takemiya et al. | |
| 6,384,459 B1 | 5/2002 | Matsuda | |
| 6,455,774 B1 | 9/2002 | Webster | |
| 6,465,786 B1 | 10/2002 | Rhodes | |
| 6,552,344 B1 | 4/2003 | Sone et al. | |

(Continued)

FOREIGN PATENT DOCUMENTS

JP   5-21698   1/1993

(Continued)

OTHER PUBLICATIONS

Okada, K. et al., U.S. Office Action, mailed Jan. 7, 2010, directed to related U.S. Appl. No. 11/639,410; 12 pages.

(Continued)

*Primary Examiner* — Chris Chu
(74) *Attorney, Agent, or Firm* — Morrison & Foerster LLP

(57) ABSTRACT

The invention provides a semiconductor device having high reliability and a method of manufacturing the same. The semiconductor device of the invention has pad electrodes formed on a semiconductor die near the side surface portion thereof and connected to a semiconductor integrated circuit or the like in the semiconductor die, a supporting body formed on the pad electrodes, an insulation film formed on the side and back surface portions of the semiconductor die, wiring layers connected to the back surfaces of the pad electrodes and extending from the side surface portion onto the back surface portion of the semiconductor die so as to contact the insulation film, and a second protection film formed on the side surface portion of the supporting body.

3 Claims, 8 Drawing Sheets

U.S. PATENT DOCUMENTS

| | | | |
|---|---|---|---|
| 6,563,192 B1 | 5/2003 | Corisis et al. | |
| 6,646,289 B1 * | 11/2003 | Badehi | 257/81 |
| 6,693,337 B2 | 2/2004 | Yoneda et al. | |
| 6,717,147 B2 | 4/2004 | Oda | |
| 6,838,748 B2 * | 1/2005 | Ishio et al. | 257/659 |
| 7,102,238 B2 | 9/2006 | Noma et al. | |
| 7,183,589 B2 | 2/2007 | Kameyama et al. | |
| 7,274,101 B2 * | 9/2007 | Tomita et al. | 257/730 |
| 7,332,783 B2 | 2/2008 | Misawa | |
| 7,332,789 B2 | 2/2008 | Violette | |
| 7,374,971 B2 * | 5/2008 | Yuan et al. | 438/113 |
| 7,374,972 B2 * | 5/2008 | Kwon et al. | 438/113 |
| 7,413,931 B2 * | 8/2008 | Noma et al. | 438/114 |
| 7,569,409 B2 * | 8/2009 | Lin et al. | 438/33 |
| 7,576,361 B2 | 8/2009 | Agranov et al. | |
| 7,759,779 B2 * | 7/2010 | Okada et al. | 257/678 |
| 7,781,250 B2 * | 8/2010 | Wang et al. | 438/68 |
| 2001/0050408 A1 | 12/2001 | Bernstein et al. | |
| 2002/0019069 A1 | 2/2002 | Wada | |
| 2003/0160185 A1 | 8/2003 | Homme | |
| 2003/0230805 A1 * | 12/2003 | Noma et al. | 257/737 |
| 2004/0016983 A1 | 1/2004 | Misawa | |
| 2004/0076797 A1 | 4/2004 | Zilber et al. | |
| 2004/0108588 A1 | 6/2004 | Gilleo | |
| 2004/0130640 A1 | 7/2004 | Fujimori | |
| 2004/0161920 A1 * | 8/2004 | Noma | 438/620 |
| 2004/0183152 A1 | 9/2004 | Yoneda et al. | |
| 2004/0187916 A1 | 9/2004 | Hezel | |
| 2004/0188699 A1 | 9/2004 | Kameyama et al. | |
| 2005/0009238 A1 * | 1/2005 | Okigawa | 438/119 |
| 2005/0048740 A1 | 3/2005 | Noma et al. | |
| 2005/0077458 A1 | 4/2005 | Ma et al. | |
| 2005/0258447 A1 | 11/2005 | Oi et al. | |
| 2006/0079019 A1 * | 4/2006 | Kim | 438/106 |
| 2007/0145420 A1 | 6/2007 | Okada et al. | |
| 2007/0145590 A1 | 6/2007 | Noma et al. | |
| 2007/0210437 A1 * | 9/2007 | Noma et al. | 257/690 |
| 2008/0258258 A1 | 10/2008 | Horikoshi et al. | |
| 2008/0277793 A1 * | 11/2008 | Noma et al. | 257/758 |
| 2010/0038668 A1 * | 2/2010 | Noma | 257/98 |
| 2010/0164086 A1 * | 7/2010 | Noma et al. | 257/686 |

FOREIGN PATENT DOCUMENTS

| | | |
|---|---|---|
| JP | 9-321333 | 12/1997 |
| JP | 2000-349238 | 12/2000 |
| JP | 2001-085652 A | 3/2001 |
| JP | 2004-55674 | 2/2004 |
| JP | 2006-93367 | 4/2006 |
| KR | 10-2002-0048716 | 6/2002 |
| KR | 10-2004-0077472 | 9/2004 |
| KR | 10-2004-0092435 A | 11/2004 |
| KR | 10-2005-0016041 A | 2/2005 |
| WO | WO 99/40624 | 8/1999 |
| WO | WO-2005/004195 | 1/2005 |

OTHER PUBLICATIONS

Horikoshi, K. et al., U.S. Office Action mailed Jul. 23, 2010, directed to U.S. Appl. No. 12/103,857; 10 pages.

Okada, K. et al., U.S. Office Action mailed Aug. 4, 2010, directed to U.S. Appl. No. 11/639,410; 14 pages.

Horikoshi, K. et al., U.S. Office Action, mailed Apr. 13, 2010, directed to a related U.S. Appl. No. 12/103,857; 12 pages.

Horikoshi, K. et al., U.S. Office Action mailed on Sep. 21, 2009, directed to a related U.S. Appl. No. 12/103,857; 13 pages.

Horikoshi, K. U.S Office Action, mailed Feb. 19, 2009, directed to a related U.S. Appl. No. 12/103,857; 8 pages.

Noma, T. et al., U.S. Office Action, mailed Mar. 11, 2009, directed to a related U.S. Appl. No. 11/639,411; 11 pages.

Okada, K. et al., U.S. Office Action, mailed Jan. 3, 2008, directed to a related U.S. Appl. No. 11/639,410; 11 pages.

Okada, K. et al., U.S. Office Action, mailed Jun. 25, 2008, directed to a related U.S. Appl. No. 11/639,410; 13 pages.

Okada, K. et al., U.S. Office Action, mailed Dec. 30, 2008, directed to a related U.S. Appl. No. 11/639,410; 15 pages.

European Search Report, mailed Jun. 10, 2009, directed to European Patent Application No. 06026027.0; 6 pages.

European Search Report, mailed Jun. 10, 2009, directed to European Patent Application No. 06026088.2; 5 pages.

Okada, K. et al., U.S. Office Action, mailed Jul. 22, 2009, directed to related U.S. Appl. No. 11/639,410; 16 pages.

Horikoshi, K. et al., U.S. Office Action, mailed Oct. 19, 2010, directed to a related U.S. Appl. No. 12/103,857; 9 pages.

Okada, K. et al., U.S. Office Action mailed Jan. 7, 2011, directed to U.S. Appl. No. 11/639,410; 17 pages.

* cited by examiner

SEMICONDUCTOR DEVICE AND METHOD OF MANUFACTURING THE SAME

CROSS-REFERENCE OF THE INVENTION

The application claims priority from Japanese Patent Application No. 2007-195820, the content of which is incorporated herein by reference in its entirety.

BACKGROUND OF THE INVENTION

1. Field of the Invention

The invention relates to a semiconductor device and a method of manufacturing the same, particularly, a CSP (Chip Size Package) type semiconductor device and a method of manufacturing the same.

2. Description of the Related Art

A CSP has received attention in recent years as a new packaging technology. The CSP is a small package having about the same outside dimensions as those of a semiconductor die packaged in it. A BGA (Ball Grid Array) type semiconductor device has been known as a type of the CSP. The BGA type semiconductor device has a plurality of ball-shaped conductive terminals made of metal such as solder arrayed on one side of the package.

A thinner semiconductor die has been required for increasing packaging density. For satisfying this, it is necessary to thin a semiconductor substrate. However, a thinner substrate may not be carried in a manufacturing process since it warps or breaks due to its low strength. Therefore, a supporting body such as a glass substrate or a protection tape is attached to one surface of a semiconductor substrate, and the other surface where the supporting body is not attached is thinned by grinding.

FIG. 10 is a cross-sectional view schematically showing a conventional BGA type semiconductor device having a supporting body. A semiconductor integrated circuit 101 configured of elements such as a CCD (Charge Coupled Device) image sensor or a CMOS image sensor is formed on the front surface of a semiconductor substrate 100 made of silicon (Si) or the like, and pad electrodes 102 electrically connected to the semiconductor integrated circuit 101 are further formed with an insulation film 103 being interposed therebetween. The pad electrodes 102 are covered by a passivation film 104 made of a silicon nitride film or the like.

A supporting body 105 made of a glass substrate is attached to the front surface of the semiconductor substrate 100 with an adhesive layer 106 made of epoxy resin or the like being interposed therebetween. The supporting body 105 is formed thick for firmly supporting the semiconductor substrate 100 which is to be thinned in the manufacturing process and preventing the supporting body 105 itself from warping or breaking. For example, if the semiconductor substrate 100 is about 100 μm in thickness after it is thinned, the supporting body 105 is about 400 μm in thickness.

An insulation film 107 made of a silicon oxide film, a silicon nitride film or the like is formed on the side and back surfaces of the semiconductor substrate 100. Furthermore, wiring layers 108 electrically connected to the pad electrodes 102 are formed on the insulation film 107 along the side and back surfaces of the semiconductor substrate 100. A protection film 109 made of a solder resist or the like is formed covering the insulation film 107 and the wiring layers 108. Openings are formed in predetermined regions of the protection film 109, and ball-shaped conductive terminals 110 are formed being electrically connected to the wiring layers 108 through these openings.

Such a semiconductor device is produced through a cutting process (a so-called dicing process) in which the supporting body 105, the protection film 109 and so on are cut along predetermined dicing lines DL as boundaries of devices into the individual devices with a dicing blade.

This type of art is described in Japanese Patent Application Publication No. 2006-93367, for example.

In the above described semiconductor device, the supporting body 105 made of a glass substrate remain exposed after it is diced. Since the glass side surface which is damaged by the dicing is exposed, it is likely that the glass cracks or breaks due to a physical impact from outside.

Although an IR cut coating may be formed on a primary surface of the supporting body 105 in order to cut a certain wavelength of light for application to an illumination sensor, the IR cut coating is not formed on a side surface of the supporting body 105, because it is difficult to form an IR cut coating on the side surface. Therefore, when there is incident light on the that side surface, the interference IR cut coating does not effectively cut oblique incident light and thus may cause the device property degrading. This influence is becoming a matter of concern particularly as the distance between a die end portion and a light receiving element is becoming shorter due to reduction in the die size.

SUMMARY OF THE INVENTION

The invention provides a semiconductor device that includes a semiconductor die having a circuit element formed on its front surface, a supporting body attached to the front surface of the die, and a protection film covering the side surface of the supporting body.

The invention also provides a method of manufacturing a semiconductor device. The method includes providing a semiconductor substrate including a first insulation film formed on its front surface and a pad formed on the first insulation film, attaching a supporting body to the front surface of the substrate so as to cover the front surface of the pad, forming an opening in the substrate from its back surface so as to expose part of the first insulation film, forming a second insulation film on the back surface of the substrate and the exposed part of the first insulation film, removing a portion of the first insulation film and a portion of the second insulation film so as to expose at least a portion of a back surface of the pad, forming a wiring on the back surface of the substrate and a side surface of the substrate so as to be connected to the exposed back surface of the pad, forming a first protection film on the back surface of the semiconductor substrate so as to cover the wiring, attaching a dicing tape to the surface of the supporting body which is not attached to the front surface of the substrate, dicing the semiconductor substrate and the supporting body with the dicing tape attached to the supporting body so as to make a slit on the supporting body, forming a second protection film in the slit, and dicing the second protection film in the slit so as to leave part of the second protection film on a side surface of the diced supporting body.

DETAILED DESCRIPTION OF THE INVENTION

An embodiment of the invention will be described referring to figures. FIGS. 1 to 9 are cross-sectional views and plan views of a semiconductor device of the embodiment shown in the order of the manufacturing process steps. The manufacturing process described below is performed using a wafer-shaped semiconductor substrate and a number of semiconductor devices are formed in a matrix configuration along predetermined dicing lines DL as boundaries, although the description will be given on the process of forming one of these semiconductor devices for convenience.

Figure 1:
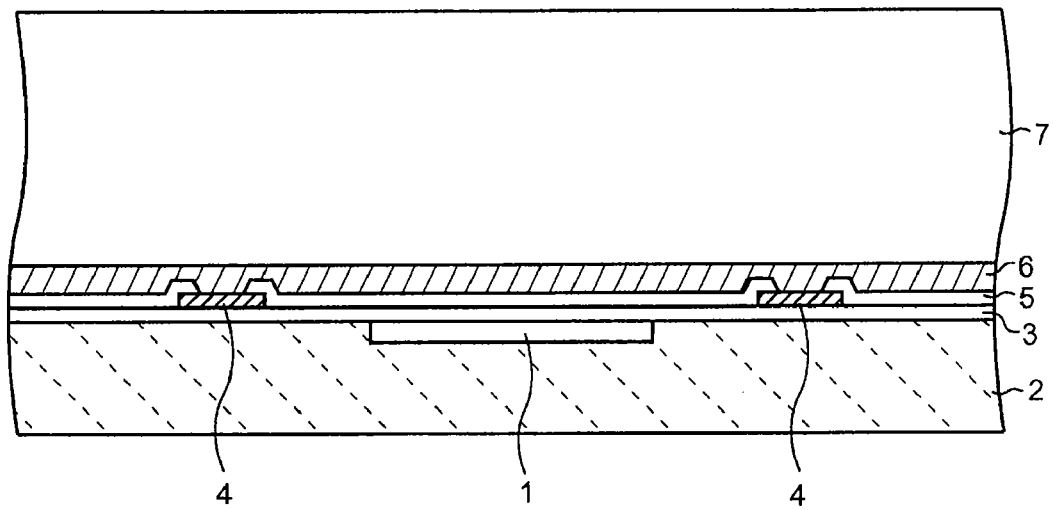
FIGS. 1 to 2 and 4 to 9 are cross-sectional views for explaining a method of manufacturing a semiconductor device of an embodiment of the invention.

First, as shown in FIG. 1, a wafer-shaped semiconductor substrate 2 made of silicon (Si) or the like formed with a semiconductor integrated circuit 1 (e.g. a driver circuit or a logic circuit configured by integrating semiconductor elements such as a light receiving element such as a CCD sensor, a CMOS sensor, an illumination sensor or the like, a light emissive element, or a transistor, wirings connected to these, or the like) on its front surface is prepared. The semiconductor substrate 2 is about 300 to 700 μm in thickness, for example. An insulation film 3 (e.g. a silicon oxide film formed by a thermal oxidation method, a CVD method or the like) is then formed on the front surface of the semiconductor substrate 2 to have a thickness of 2 μm, for example.

Then, a metal layer made of aluminum (Al), an aluminum alloy, copper (Cu) or the like is formed by a sputtering method, a plating method or other film deposition method. This metal layer is then etched using a resist layer (not shown) as a mask to form pad electrodes 4 having a thickness of, for example, 1 μm on the insulation film 3. The pad electrode 4 is an electrode for external connection, which is electrically connected to the semiconductor integrated circuit 1 or other peripheral element through a wiring (not shown). Then, a supply voltage, a ground voltage or various signals is supplied from a conductive terminal 12, which will be described below, to the semiconductor integrated circuit 1, the semiconductor substrate 2 and so on through the pad electrode 4. The position of the pad electrodes 4 is not limited to this and these may be disposed above the semiconductor integrated circuit 1.

Then, a passivation film 5 (e.g. a silicon oxide film, a silicon nitride film or the like formed by a CVD method) is formed on the front surface side of the semiconductor substrate 2 so as to partially or entirely cover the pad electrodes 4. In FIG. 1, the passivation film 5 partially covers the pad electrodes 4.

Then, a wafer-shaped supporting body 7 is attached to the front surface of the semiconductor substrate 2 including on the pad electrodes 4 with an adhesive layer 6 made of epoxy resin, polyimide (e.g. photosensitive polyimide), resist, acrylic or the like being interposed therebetween. In this embodiment, the surface of the supporting body 7 on the semiconductor substrate 2 side is referred to as the front surface and the other surface is referred to as the back surface. If the semiconductor integrated circuit 1 includes a light receiving element or a light emissive element, the adhesive layer 6 is preferably made of a suitable transparent material having a property of transmitting light since it serves as a path of light emitted from the semiconductor integrated circuit 1 or entering the semiconductor integrated circuit 1.

The supporting body 7 is made of, for example, glass. This may be made of other rigid substrate of silicon, quartz, ceramic, metal or the like instead of glass. The supporting body 7 has a function of supporting the semiconductor substrate 2 and protecting the front surface of the element, and has a thickness of, for example, about 400 μm. If the semiconductor integrated circuit 1 includes a light receiving element or a light emissive element, the supporting body 7 is made of a transparent or semitransparent material and has a property of transmitting light. Furthermore, when the semiconductor device of the invention is applied to an illumination sensor, an interference IR cut coating is formed on the glass surface of the supporting body 7 in order to cut a predetermined wavelength of light although not described with a figure.

Then, back-grinding is performed to the back surface of the semiconductor substrate 2 using a back surface grinder to reduce the thickness of the semiconductor substrate 2 to a predetermined thickness (e.g. about 100 μm). This grinding process may be replaced by an etching process or the combination of the grinder and the etching process. There is also a case where the grinding process is not necessary depending on the application or specification of an end-product and the initial thickness of the provided semiconductor substrate 2.

Figure 2:
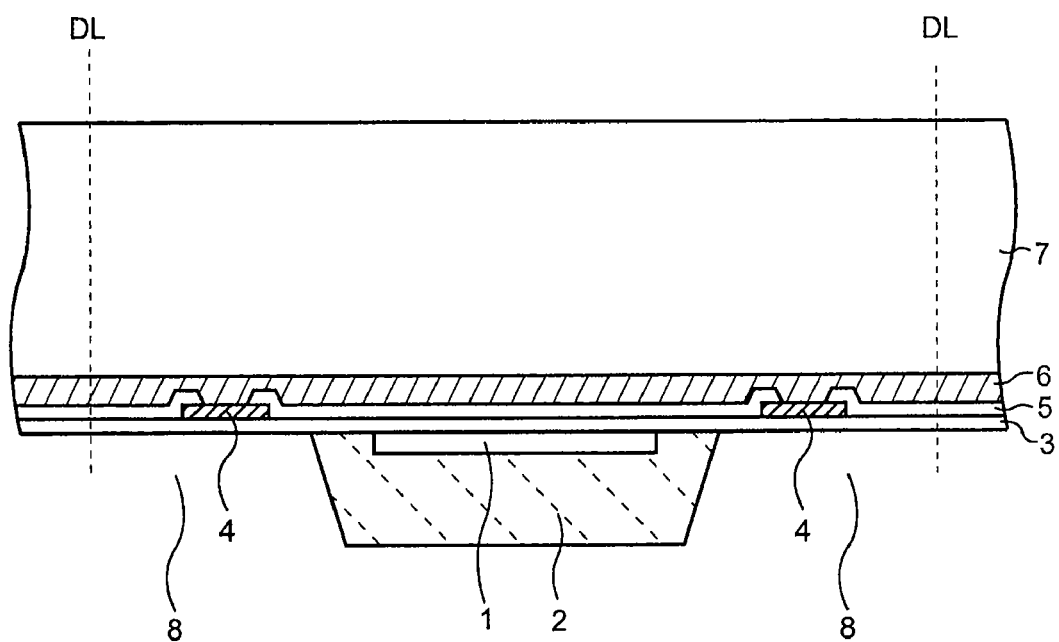

Then, as shown in FIG. 2, the semiconductor substrate 2 is selectively etched only in predetermined regions corresponding to the pad electrodes 4 from the back surface side of the semiconductor substrate 2 to partially expose the first insulation film 3. Hereafter, this exposed portion is referred to as an opening 8. By this process, the wafer-shaped semiconductor substrate 2 is formed into an island-like shape as shown in FIGS. 3A and 3B.

This selective etching of the semiconductor substrate 2 will be described referring to FIGS. 3A and 3B. FIGS. 3A and 3B are schematic plan views on the semiconductor substrate 2 side, and FIG. 2 corresponds to a cross-sectional view along line X-X of FIGS. 3A and 3B.

Figure 3A:
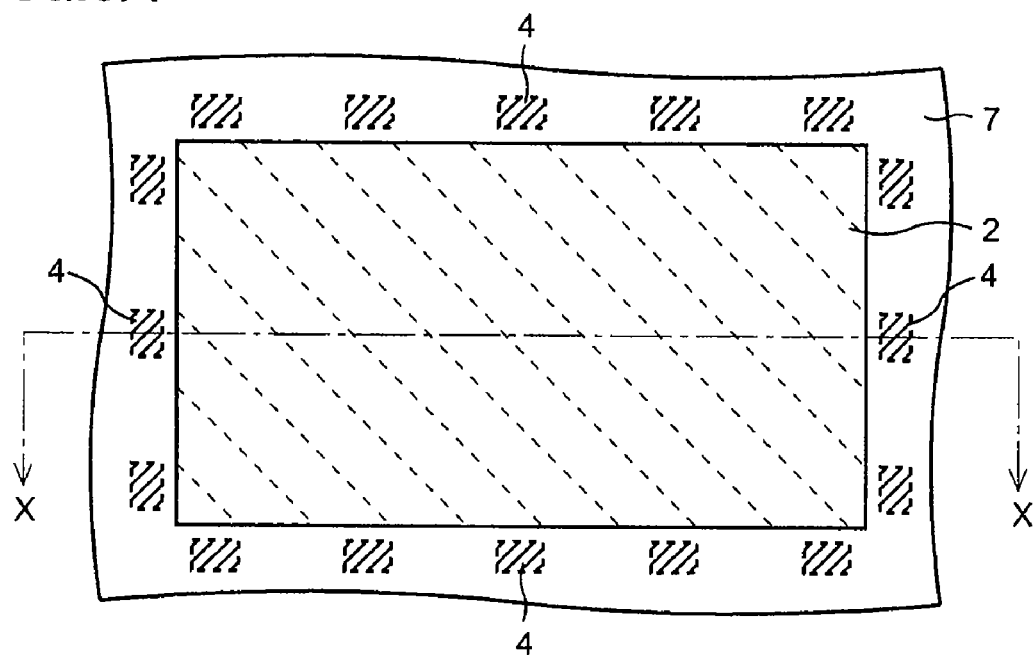
FIGS. 3A and 3B are plan views for explaining the method of manufacturing the semiconductor device of the embodiment of the invention.
Figure 3B:
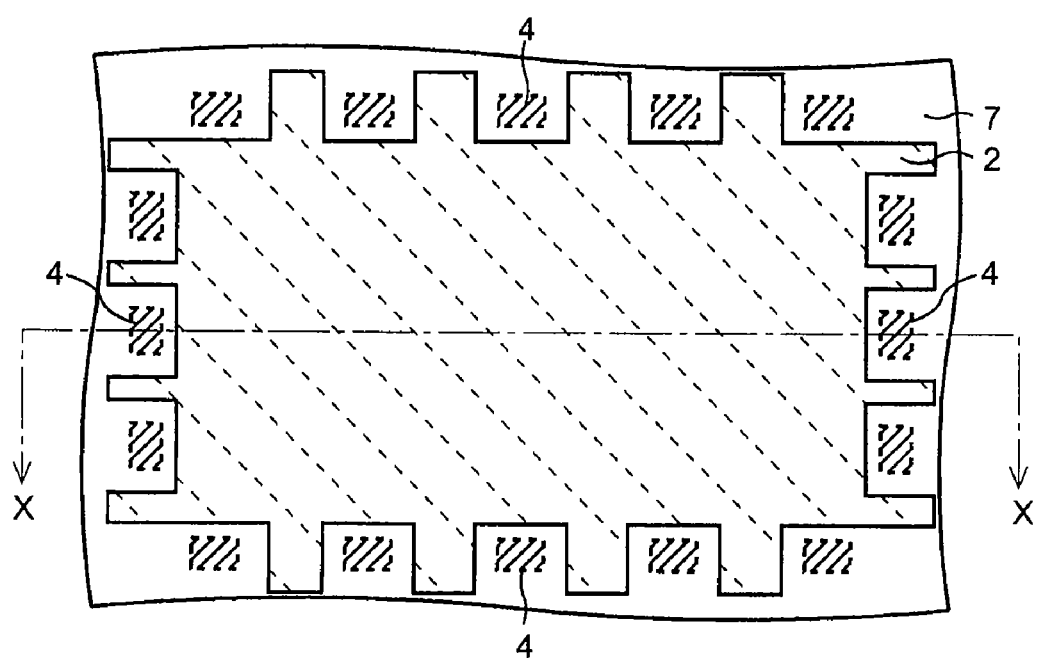

As shown in FIG. 3A, the semiconductor substrate 2 may be etched into an almost rectangular shape smaller than the supporting body 7. Alternatively, as shown in FIG. 3B, the semiconductor substrate 2 may be etched only in a region formed with the pad electrodes 4 so as to have an uneven periphery. The latter provides the larger overlapping area between the semiconductor substrate 2 and the supporting body 7 and the semiconductor substrate 2 remains near the periphery of the supporting body 7. Therefore, the latter structure is preferable for enhancing the support strength of the supporting body 7 for the semiconductor substrate 2. Furthermore, since the latter structure prevents the supporting body 7 from warping due to the difference in coefficient of thermal expansion between the semiconductor substrate 2 and the supporting body 7, cracking or separation in the semiconductor device is prevented. It is noted that the semiconductor substrate 2 may be designed into other plane shape than the shapes shown in FIGS. 3A and 3B. Hereafter, the description will be given about the manufacturing process in the case where the semiconductor substrate 2 is etched as shown in FIG. 3A.

Furthermore, although the sidewall of the semiconductor substrate 2 is etched obliquely so that the width of the semiconductor substrate 2 is wider on the front surface side in this embodiment, the semiconductor substrate 2 may be etched to have the constant width and form the sidewall perpendicular to the main surface of the supporting body 7.

Figure 4:
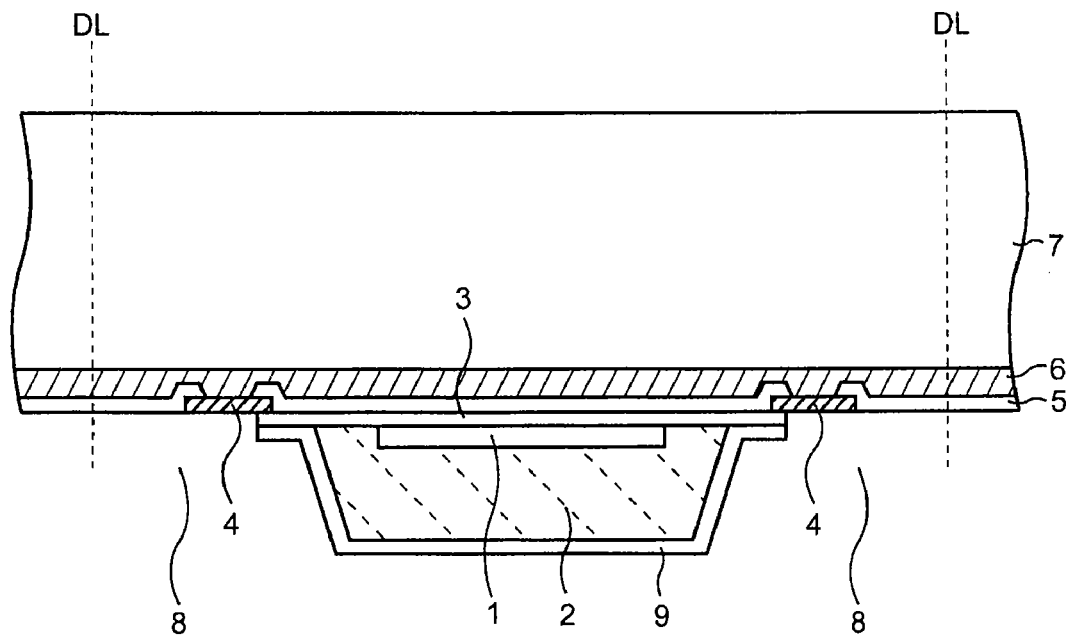

Then, an insulation film 9 made of a silicon oxide film, a silicon nitride film or the like is formed on the side and back surfaces of the semiconductor substrate 2 including in the opening 8 by a plasma CVD method or the like. As shown in FIG. 4, the insulation film 3 and the insulation film 9 are then selectively etched using a resist layer (not shown) as a mask.

By this etching, the insulation film 3 and the insulation film 9 formed in a region from a portion of the pad electrodes 4 to the dicing lines DL are selectively removed to expose at least a portion of each of the pad electrodes 4 on the bottom of the opening 8.

Figure 5:
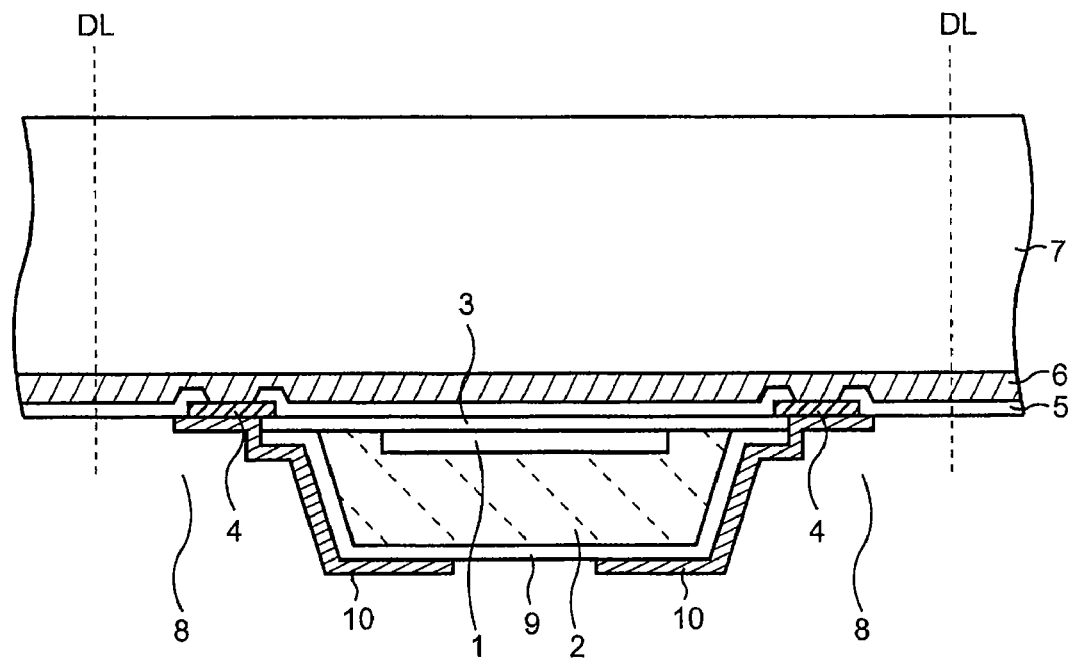

Then, a metal layer made of aluminum (Al), copper (Cu) or the like for wiring layers 10 is formed by a sputtering method, a plating method or other film deposition method to have a thickness of, for example, 1 μm. Then, this metal layer is selectively etched using a resist layer (not shown) as a mask. By this etching, the metal layer forms the wiring layers 10 along the side and back surfaces of the semiconductor substrate 2 and connected to the pad electrodes 4, as shown in FIG. 5.

Then, an electrode connect layer (e.g. a lamination layer of a nickel layer and a metal layer) (not shown) is formed so as to cover the wiring layers 10. The electrode connect layer is formed because the wiring layer 10 made of aluminum or the like and the conductive terminal 12 made of solder or the like are hardly attached together and for the purpose of preventing the material of the conductive terminal 12 from entering the wiring layer 10 side.

Figure 6:
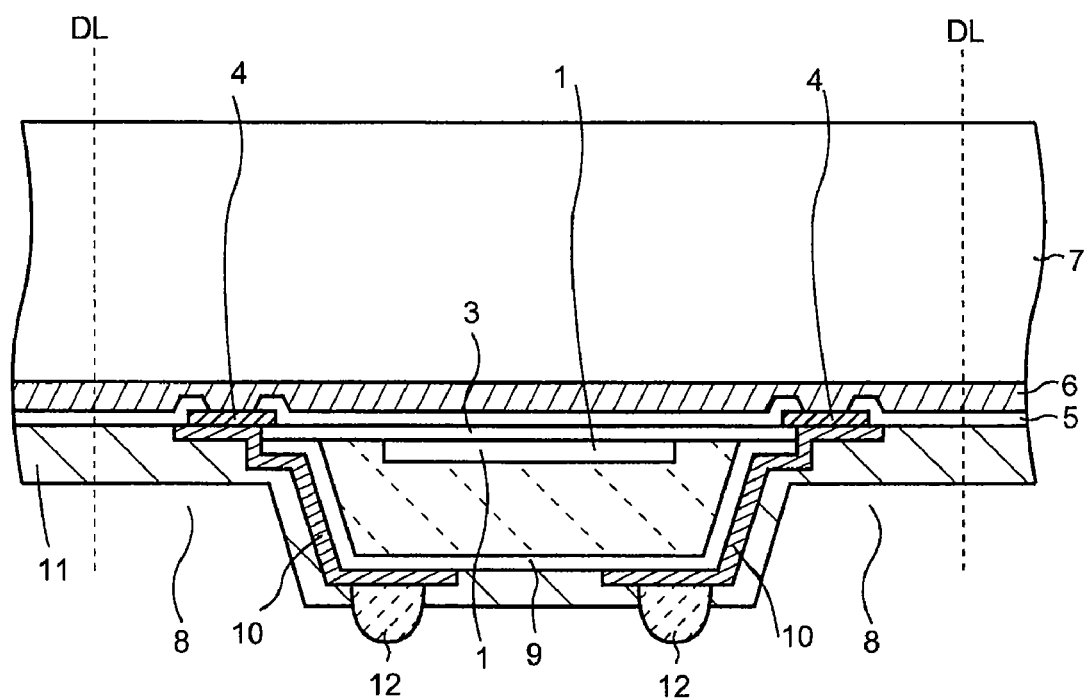

Then, as shown in FIG. 6, a first protection film 11 is formed on the back surface side of the semiconductor substrate 2 so as to cover the wiring layers 10. It is noted that the electrode connect layer may be formed after the formation of the first protection film 11.

Then, a conductive material (e.g. solder) is screen-printed on the electrode connect layer exposed in openings of the protection layer 11, and this conductive material is reflowed by a heat treatment to form the ball-shaped conductive terminals 12 as shown in FIG. 6. The method of forming the conductive terminals 12 is not limited to the above, and these may be formed by an electrolytic plating method or a so-called dispensing method where solder or the like is applied to a predetermined region with a dispenser. The pad electrodes 4 are thus electrically connected to the conductive terminals 12 through the wiring layers 10.

Figure 7:
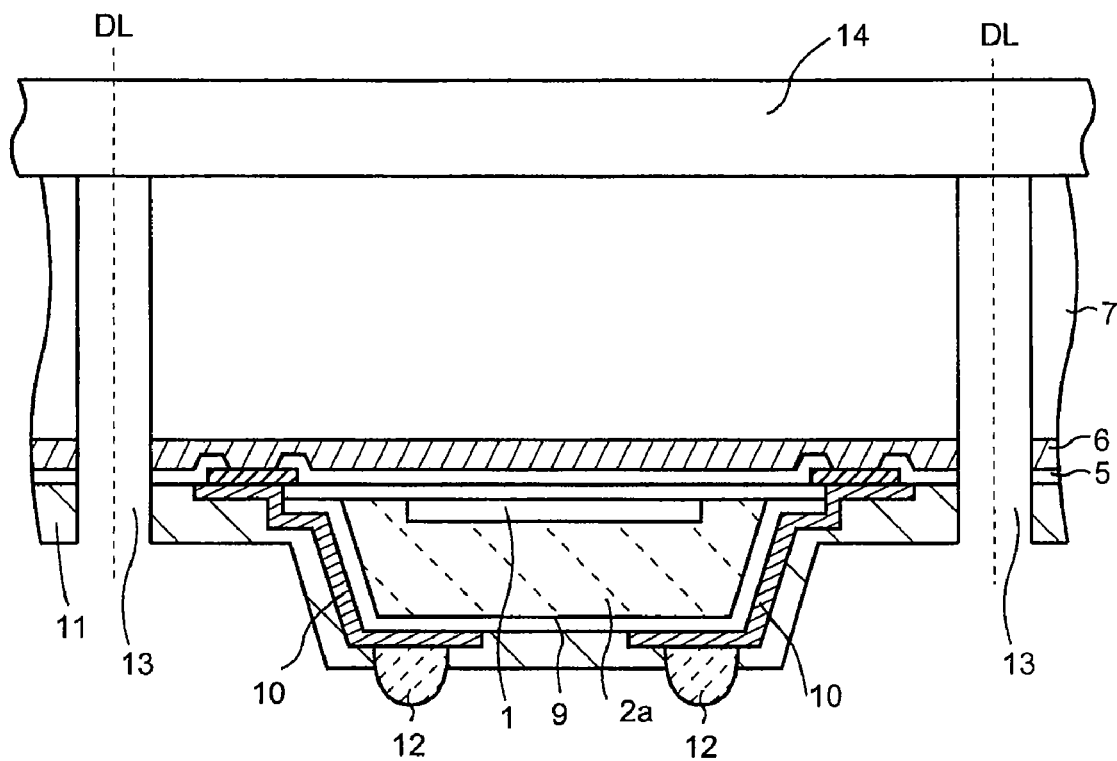

Then, as shown in FIG. 7, with a dicing tape (e.g. a UV tape 14) being attached to the back surface side of the supporting body 7, the first protection film 11, the insulation film 5, the adhesive layer 6 and the supporting body 7 are partially removed along boundaries of individual semiconductor devices (dicing lines DL) from the semiconductor substrate 2 side with a dicing blade or by dry-etching, thereby forming openings 13. By this process, the semiconductor substrate 2 is divided into semiconductor dies. Hereafter, the description will be continued referring to this die as a semiconductor die 2a.

The cross-sectional shape of the opening 13 is not limited to vertical as shown in FIG. 7, and may form any shapes.

Figure 8:
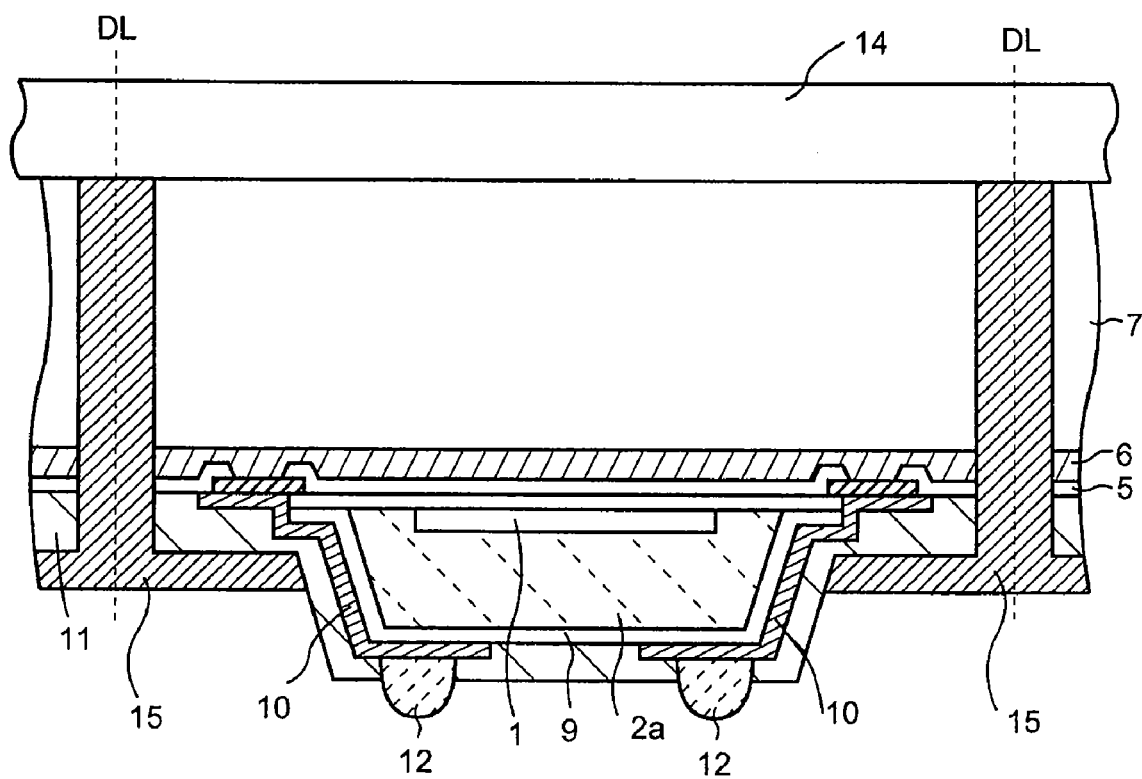

Then, as shown in FIG. 8, a second protection film 15 is formed from the openings 13 to the side surface of the semiconductor die 2a. It is noted that the second protection film 15 may cover the semiconductor die 2a entirely.

In this process, the second protection film 15 is formed as follows, for example. First, by a dispensing (coating) method, for example, resin is sealingly applied in the openings 13 to the side surface of the semiconductor die 2a. An organic material such as polyimide resin, a solder resist film or the like may be used as the material of the second protection film 15.

An absorbent material absorbing visible light, an infrared ray or the like may be used as the material of the second protection film 15. As a method of forming the second protection film 15, a screen-printing method may be used depending on the depth of the openings 13.

Figure 9:
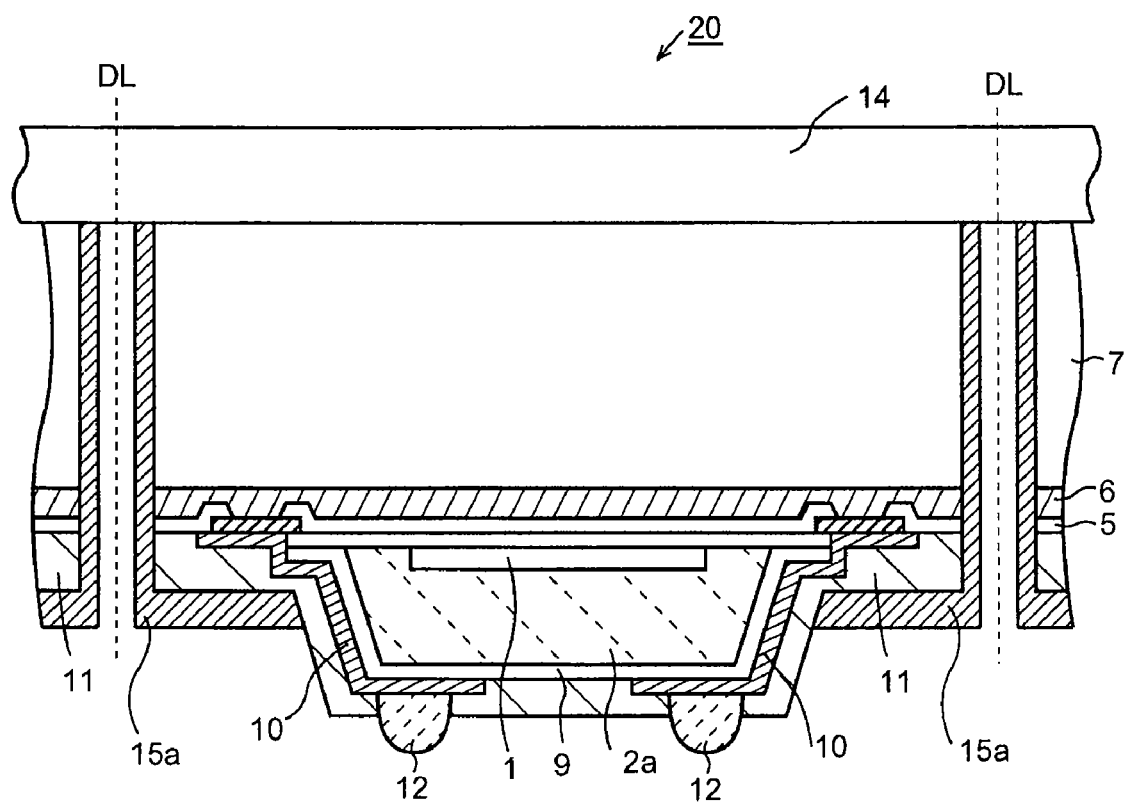
Figure 10:
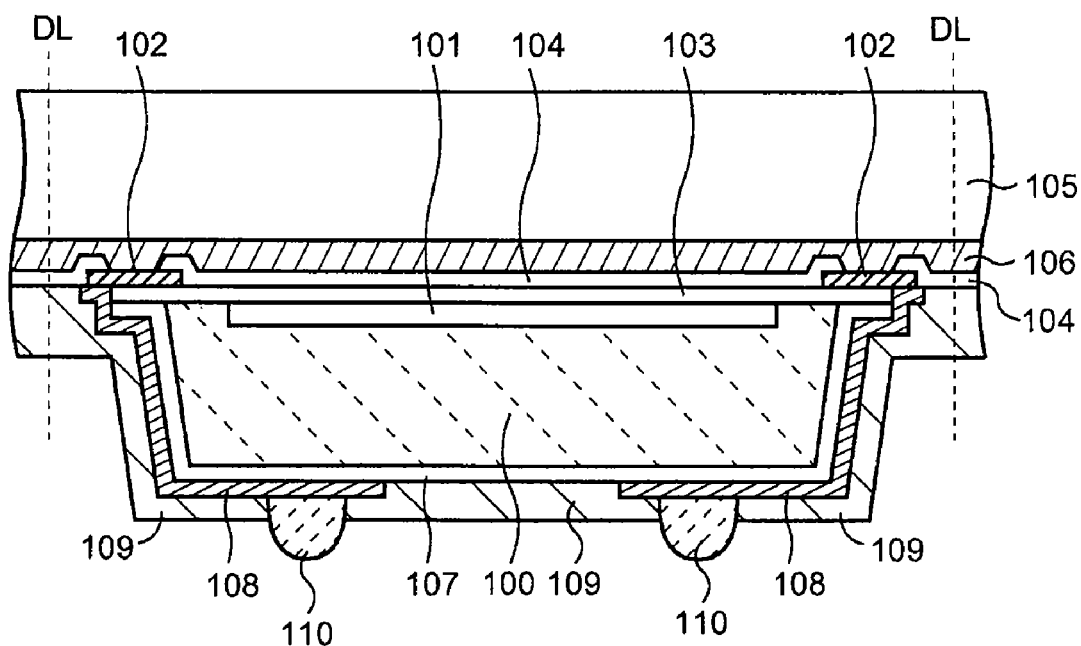
FIG. 10 is a cross-sectional view for explaining a conventional semiconductor device.

Then, the second protection film 15 is divided with a dicing blade having a smaller width than the width of the opening 13, thereby completing a chip size package type semiconductor device 20 where the second protection film 15a is formed on the side surface portion of the supporting body 7 as shown in FIG. 9. Then, the semiconductor device 20 after the UV tape 14 is separated therefrom is mounted on a printed board or the like through the conductive terminals 12.

In the semiconductor device 20 of the invention, since the second protection film 15a is formed on the side surface portion of the supporting body 7, the glass as the supporting body 7 is not exposed after dicing, thereby preventing the supporting body 7 from cracking or breaking due to a physical impact from outside or the like.

Furthermore, when the device is applied to an illumination sensor, the presence of the second protection film 15a prevents oblique incident light entering for which the interference IR cut coating has a low cutting property, thereby providing the semiconductor device having high reliability.

Furthermore, the invention is not limited to the above-described embodiment and modification is possible within the scope of the invention. For example, while the BGA (Ball Grid Array) type semiconductor device having the ball-shaped conductive terminals is used for the above description of the embodiment, the invention is also applicable to the LGA (Land Grid Array) type or other CSP (Chip Size Package) type semiconductor device.

Furthermore, in the above embodiment, the conductive terminals 12 are formed on the back surface of the semiconductor substrate with the wiring layers 10 being interposed therebetween. However, for example, the conductive terminals may be directly connected to the pad electrodes 4 without through the wiring layers 10, being disposed near the side surface of the semiconductor substrate.

Furthermore, the invention may be applied to, for example, a semiconductor device where openings are provided so as to expose the pad electrodes 4 from the back surface of the semiconductor substrate 2 and penetrating electrodes are formed through these openings.

In the invention, since the protection film is formed covering the side surface portion of the supporting body, the supporting body is prevented from directly receiving a physical impact from outside. Furthermore, the protection film prevents oblique incident light from entering through the supporting body, thereby enhancing the device property.

What is claimed is:

1. A semiconductor device comprising:
    a semiconductor die comprising a circuit element formed on a front surface thereof;
    a pad formed on the front surface of the die and connected to the circuit element;
    a supporting body made of an inorganic material or a metal and attached to the front surface of the die so as to cover a front surface of the pad;
    an insulation film formed on a side surface of the die and a back surface of the die;
    a wiring disposed on the insulating film so as to be on the back surface of the die and the side surface of the die and to be connected to a back surface of the pad; and
    a protection film covering a side surface of the supporting body,
    wherein the protection film extends from the side surface of the supporting body so as to cover the pad and the back surface of the semiconductor die.

2. The semiconductor device of claim 1, further comprising a conductive terminal disposed on and connected to the wiring through an opening formed in the protection film.

3. A semiconductor device comprising:
a semiconductor die comprising a circuit element formed on a front surface thereof;
a pad formed on the front surface of the die and connected to the circuit element;
a supporting body made of an inorganic material or a metal and attached to the front surface of the die so as to cover a front surface of the pad;
an electrode portion disposed on the back surface of the die and connected to a back surface of the pad; and
a protection film covering a side surface of the supporting body, the pad and the back surface of the semiconductor die.

* * * * *